United States Patent [19]
Walters, Jr.

[11] Patent Number: 4,800,300
[45] Date of Patent: Jan. 24, 1989

[54] HIGH-PERFORMANCE, CMOS LATCH FOR IMPROVED RELIABILITY

[75] Inventor: Donald M. Walters, Jr., Austin, Tex.

[73] Assignee: Advanced Micro Devices, Inc., Sunnyvale, Calif.

[21] Appl. No.: 115,279

[22] Filed: Nov. 2, 1987

[51] Int. Cl.⁴ .............................................. G11C 11/40
[52] U.S. Cl. .................................. 307/279; 307/452; 307/572.2; 307/585; 365/156
[58] Field of Search ............... 307/279, 448, 451, 452, 307/481, 571, 577, 579, 585, 594, 272.2, 238.6; 365/154, 156

[56] References Cited

U.S. PATENT DOCUMENTS

| | | | |
|---|---|---|---|
| 4,251,739 | 2/1981 | Morozumi | 307/279 |
| 4,506,167 | 3/1985 | Little et al. | 307/279 |
| 4,617,480 | 10/1986 | Au | 307/452 |
| 4,629,909 | 12/1986 | Cameron | 307/279 |

Primary Examiner—Stanley D. Miller
Assistant Examiner—Nancy Thai
Attorney, Agent, or Firm—Davis Chin

[57] ABSTRACT

A CMOS latch circuit is provided which eliminates the lowering of a high voltage level from a precharge/discharge data bus line caused by charge-sharing effect. The CMOS latch circuit is formed of a P-channel precharge transistor (P1), a P-channel drive transistor (P2), an N-channel drive transistor (N1), an N-channel enable transistor (N2), and a transimission gate (TG) for loading a complementary data input signal to a storage node (A) in response to true and complementary load signals. The latch circuit further includes output transistor devices formed of a pair of P-channel output transistors (P3, P4) and a pair of N-channel output transistors (N3, N4) which are all connected in series, and are responsive to true and complementary load signals and to true and complementary data output signals for maintaining the latch circuit in one of two states.

13 Claims, 1 Drawing Sheet

CMOS LATCH CIRCUIT

CMOS LATCH CIRCUIT

CMOS LATCH CIRCUIT
WITH TWO DATA SOURCES and a drain connected to the drain of the P-channel drive transistor, a gate connected to a first input terminal for receiving a complementary data input signal, and a source. The N-channel enable transistor has a drain connected to the source of the N-channel drive transistor, a gate connected to a second input terminal for receiving a true load signal, and a source connected to a ground potential.

HIGH-PERFORMANCE, CMOS LATCH FOR IMPROVED RELIABILITY

BACKGROUND OF THE INVENTION

This invention relates generally to static latches employed in digital logic systems and more particularly, it relates to an improved CMOS latch for implementation as part of an integrated circuit so as to provide a greater operational reliability and higher speeds of operation.

It is generally known that in microprocessor designs storage units are required for temporarily storing digital information. One such type of storage unit is referred to as a static latch.

One implementation of such a static latch includes a pair of inverters, a feedback path coupling the output of one inverter to the input of the other inverter, and a CMOS transmission gate. The transmission gate may be formed of an N-channel MOS transistor and a P-channel MOS transistor having their common electrodes (source or drain leads) connected to a precharge/discharge data line and the other one of the common electrodes connected to an inverter's input node. The transmission gate is operable in response to a strobe signal for transferring data from the data line to the input node for latching. Each of the common electrodes is coupled to ground by a parasitic capacitance. One disadvantage of this type of static latch is encountered when a low voltage logic state is stored and a floating high logic state is written which causes a charge-sharing effect between the parasitic capacitances, thereby reducing the high voltage level of the logic state at the input node. Consequently, a problem of reliability in its operation is experienced when the high voltage level at the input node fails to reach the trip point of the latch. The larger the size of the devices in the latch that is required to achieve a given performance, the greater is the high voltage level reduction due to this charge-sharing phenomenon.

It would therefore be desirable to provide an improved CMOS latch which eliminates the lowering of the high voltage level of the data bus line caused by charge-sharing effects. It would also be expedient to provide a CMOS latch which operates at higher speeds so as to reduce logic delays.

SUMMARY OF THE INVENTION

Accordingly, it is a general object of the present invention to provide an improved CMOS latch which overcomes the disadvantages of the prior art.

It is an object of the present invention to provide an improved CMOS latch which operates at higher speeds so as to reduce logic delays than that which has been traditionally available.

It is another object of the present invention to provide an improved CMOS latch which eliminates the lowering of the high voltage level of a data bus line caused by charge-sharing effects.

In accordance with these aims and objectives, the present invention is concerned with the provision of a CMOS latch circuit which includes a P-channel precharge transistor, a P-channel drive transistor, an N-channel drive transistor, and an N-channel enable transistor. The P-channel precharge transistor has a source connected to a supply potential, a gate, and a drain. The P-channel drive transistor has a source connected to the supply potential, a gate connected to the drain of the P-channel precharge transistor, and a drain connected to a true data output terminal. The N-channel drive The latch circuit further includes a transmission gate responsive to the true load signal and a complementary load signal for communicating the complementary data signal to the gate of the P-channel drive transistor. A series-connected arrangement of output transistors are responsive to the true and complementary load signals and are coupled to true and complementary data output signals for maintaining the latch circuit in one of two states.

In another aspect of the present invention, the latch circuit further includes a means for loading the true data output terminal with a second complementary data signal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
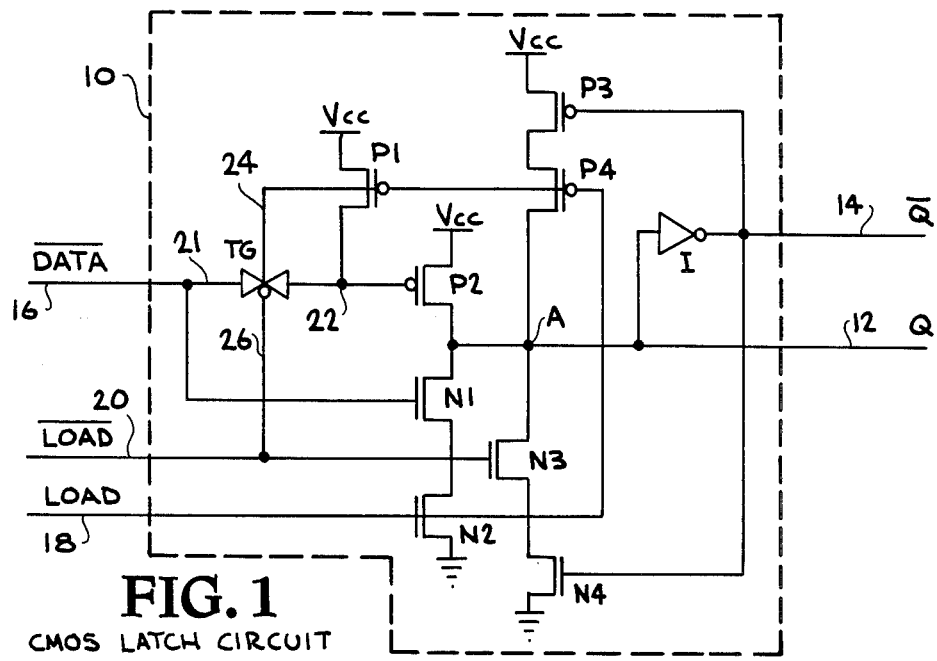
FIG. 1 is a schematic circuit diagram of a CMOS latch constructed in accordance with the principles of the present invention.

Referring now to the drawings, there is shown in FIG. 1 a CMOS latch 10 of the present invention. The CMOS latch 10 includes a P-channel precharge transistor P1, a P-channel drive transistor P2, an N-channel drive transistor N1, and an N-channel enable transistor N2. The precharge transistor P1 has its source connected to a supply voltage or potential VCC, which is typically at +5.0 volts for CMOS technology, its gate connected to the gate of the enable transistor N2, and its drain connected to the gate of the drive transistor P2. The drive transistor P2 has its source also connected to the supply potential VCC. The transistor P2 has its drain connected to the drain of the drive transistor N1, to a storage node A at an output terminal 12, and to the input of an inverter I. The output of the inverter I is connected to an output terminal 14. The output terminal 12 provides a true data output signal Q, and the output terminal 14 provides a complementary data output signal $\overline{Q}$. The drive transistor N1 has its gate connected to an input terminal 16 for receiving a complementary data signal $\overline{DATA}$. This data signal $\overline{DATA}$ is from a precharge/discharge complementary data bus line (not shown) which is normally precharged to a logic "1" state ($\overline{DATA}=1$ or $DATA=0$) and can be discharged to a logic "0" state ($\overline{DATA}=0$ or $DATA=1$). The drive transistor N1 has its source connected to the drain of the enable transistor N2. The enable transistor N2 has its gate also connected to an input terminal 18 for receiving a true load signal LOAD and its drain connected to a ground potential.

The CMOS latch 10 further includes a conventional CMOS transmission gate TG formed of a P-channel MOS transistor and an N-channel MOS transistor. The transmission gate TG has a signal input line 21, a signal output line 22, a true control line 24, and a complementary control line 26. The signal input line 21 is connected to the complementary data signal $\overline{\text{DATA}}$ via the input terminal 16, and the signal output line 22 is connected to the gate of the drive transistor P2. The true control line 24 is connected to the gate electrode of the N-channel MOS transistor of the gate TG and to the true load signal LOAD via the input terminal 18. The complementary control line 26 is connected to the gate electrode of the P-channel MOS transistor of the gate TG and to a complementary load signal $\overline{\text{LOAD}}$ via an input terminal 20. When the true load signal LOAD is at a high or logic "1" level and the complementary load signal $\overline{\text{LOAD}}$ is at a low or logic "0" level, the complementary data input signal $\overline{\text{DATA}}$ applied to the signal input line 21 will be coupled to the signal output line 22. Thus, the transmission gate TG is defined to be closed or turned on. When the true load signal LOAD is at a low logic level and the complementary load signal $\overline{\text{LOAD}}$ is at a high logic level, the complementary data signal $\overline{\text{DATA}}$ applied to the signal input line 21 will not be coupled to the signal output line 22. Thus, the transmission gate TG is defined to be opened or turned off.

The CMOS latch 10 further includes output transistor latch means formed of a pair of P-channel output MOS transistors P3, P4, and a pair of N-channel output MOS transistors N3, N4 all connected in a series arrangement. The transistor P3 has its source connected to the supply potential VCC, its gate connected to the output of the inverter I, and its drain connected to the source of the transistor P4. The transistor P4 has its gate connected to the gate of the transistor N2. The transistor P4 has its drain connected to the drain of the transistor P2, to the drain of the transistor N1, to the output terminal 12, and to the drain of the transistor N3 at the storage node A. The transistor N3 has its gate connected to the input terminal 20 for receiving the complementary load signal $\overline{\text{LOAD}}$ and its source connected to the drain of the transistor N4. The transistor N4 has its gate connected to the output of the inverter I and its source connected to the ground potential.

Before the operation of the CMOS latch 10 is explained, it will be helpful to illustrate how the true and complementary data output signals Q and $\overline{\text{Q}}$ at the respective output terminals 12 and 14 will indeed be latched and retain their original state indefinitely when the true load signal LOAD is at a low logic level (LOAD=0) and the complementary load signal $\overline{\text{LOAD}}$ is at a high logic level ($\overline{\text{LOAD}}$=1). Initially, it will be assumed that the complementary data input signal $\overline{\text{DATA}}$ is at a high logic level ($\overline{\text{DATA}}$=1), the true data output signal Q is at a low logic level (Q=0), and the complementary data output signal $\overline{\text{Q}}$ is at a high logic level ($\overline{\text{Q}}$=1). Under these conditions, the transmission gate TG will be turned off; the transistors P1, P4, N1, N3 and N4 will be turned on; and the transistors P2, P3 and N2 will be turned off. Thus, the true data output signal Q will be maintained at a low logic level since the transistors N3 and N4 are both turned on. Due to the inverter I, the complementary data output signal $\overline{\text{Q}}$ will be maintained at a high logic level which keeps the transistor P3 turned off and the transistor N4 turned on. It can be seen that the true and complementary data output signal would still be latched in their origianl states even if the complementary data input signal $\overline{\text{DATA}}$ is allowed to be discharged to a logic "0" level ($\overline{\text{DATA}}$=0). This will only have the effect of turning off the transistor N1, but will not change the states of the true and complementary data output signals.

With the true load signal LOAD still being at a low logic level ($\overline{\text{LOAD}}$=0), it will now be assumed that the complementary data input signal $\overline{\text{DATA}}$ is again at a high logic level ($\overline{\text{DATA}}$=1) but that the true data output signal Q is at a high logic level (Q=1) and the complementary data output signal $\overline{\text{Q}}$ is at a low logic level ($\overline{\text{Q}}$=0). Under these conditions, the transmission gate TG will again be turned off; the transistors P1, P3, P4, N1 and N3 will be turned on; and the transistors P2, N2, and N4 will be turned off. Thus, the true data output signal Q will be maintained at a high logic level since the output transistors P3 and P4 are both turned on. Due to the inverter I, the complementary data output signal $\overline{\text{Q}}$ will be maintained at a low logic level which keeps the transistor P3 turned on and the transistor N4 turned off. Again, it can be seen that the true and complementary data output signals would still be latched in the original states even if the complementary data input signal $\overline{\text{DATA}}$ is allowed to be discharged to a logic "0" level ($\overline{\text{DATA}}$=0). This will again only have the effect of turning off the transistor N1.

Therefore, it has been proved that the output transistors P3, P4, N3 and N4 will function as an output transistor latch means to retain the true and complementary data output signals in one of the two original states indefinitely when the transmission gate TG is turned off by the load signals (LOAD=0 and $\overline{\text{LOAD}}$=1). This will be true regardless of whether the complementary data input signal $\overline{\text{DATA}}$ is maintained at its precharged high logic level or is discharged to a low logic level.

In order to explain the operation of the latch, it will now be necessary to assume that the true load signal LOAD is at a high logic level (LOAD=1) and the complementary load signal $\overline{\text{LOAD}}$ is at a low logic level ($\overline{\text{LOAD}}$=0). In a first case, it will be further assumed that the complementary data input signal $\overline{\text{DATA}}$ is precharged by the precharge/discharge complementary data bus line to a high logic level ($\overline{\text{DATA}}$=1), the true data output signal Q is at a high logic level (Q=1), and the complementary data output signal $\overline{\text{Q}}$ is at a low logic level ($\overline{\text{Q}}$=0). Prior to the time when the true load signal LOAD switches to a high logic level, the transmission gate TG will be turned off; the transistors P1, P3, P4, N1 and N3 will be turned on; and the transistors P2, N2 and N4 will be turned off.

When the true load signal LOAD switches to the high logic level and the complementary load signal $\overline{\text{LOAD}}$ switches to the low logic level, this causes the transmission gate TG to be turned on; the transistors P1, P4 and N3 to be turned off; and the transistor N2 to be turned on. Since the complementary data input signal $\overline{\text{DATA}}$ is at a high logic level, the transistor N1 will also be turned on so as to pull or force the true data output signal Q to a low logic level. The inverter I will cause the complementary data output signal $\overline{\text{Q}}$ to go to a high logic level which turns off the transistor P3 and turns on the transistor N4. When the true load signal LOAD switches back to the low logic level, the complementary load signal $\overline{\text{LOAD}}$ will again cause the transistor N3 to turn on, thereby maintaining the true data output signal Q in the low logic level.

In a second case, it will be further assumed that the complementary data input signal $\overline{\text{DATA}}$ is allowed to be discharged to a low logic level ($\overline{\text{DATA}}=0$), the true data output signal Q is at a low logic level (Q=0), and the complementary data output signal $\overline{Q}$ is at a high logic level ($\overline{Q}=1$). Prior to the time when the true load signal LOAD switches to a high logic level, the transmission gate TG will be turned off; the transistors P1, P4, N1, N3 and N4 will be turned on; and the transistors P2, P3 and N2 will be turned off.

When the true load signal LOAD switches to the high logic level and the complementary load signal $\overline{\text{LOAD}}$ switches to the low logic level, this causes the transmission gate TG to be turned on; the transistor P1, P4 and N3 to be turned off; and the transistor N2 to be turned on. The transistor N1 will be initially turned on since the complementary data input signal $\overline{\text{DATA}}$ will be at a high logic level. However, when the complementary data input signal $\overline{\text{DATA}}$ is discharged to the low logic level, this will turn off the transistor N1 and the transistor P2 will be turned on so as to pull or force the true data output signal Q to the high logic level. The inverter I will cause the complementary data output signal $\overline{Q}$ to go to the low logic level which turns on the transistor P3 and turns off the transistor N4. When the true load signal LOAD switches back to the low logic level, this true load signal LOAD will again turn on the transistor P4, thereby maintaining the true data output signal Q in the high logic level. Further, the transmission gate TG will then be turned off and the transistor P1 will be turned on. As a result, the gate of the transistor P2 will be driven to a high logic level, thereby causing it to be turned off as well. It should be noticed that whenever the transmission gate TG is turned on both its input and output nodes are at a high logic level so as to avoid any charge-sharing effect to the latch circuit regardless of its previous state.

Figure 2:
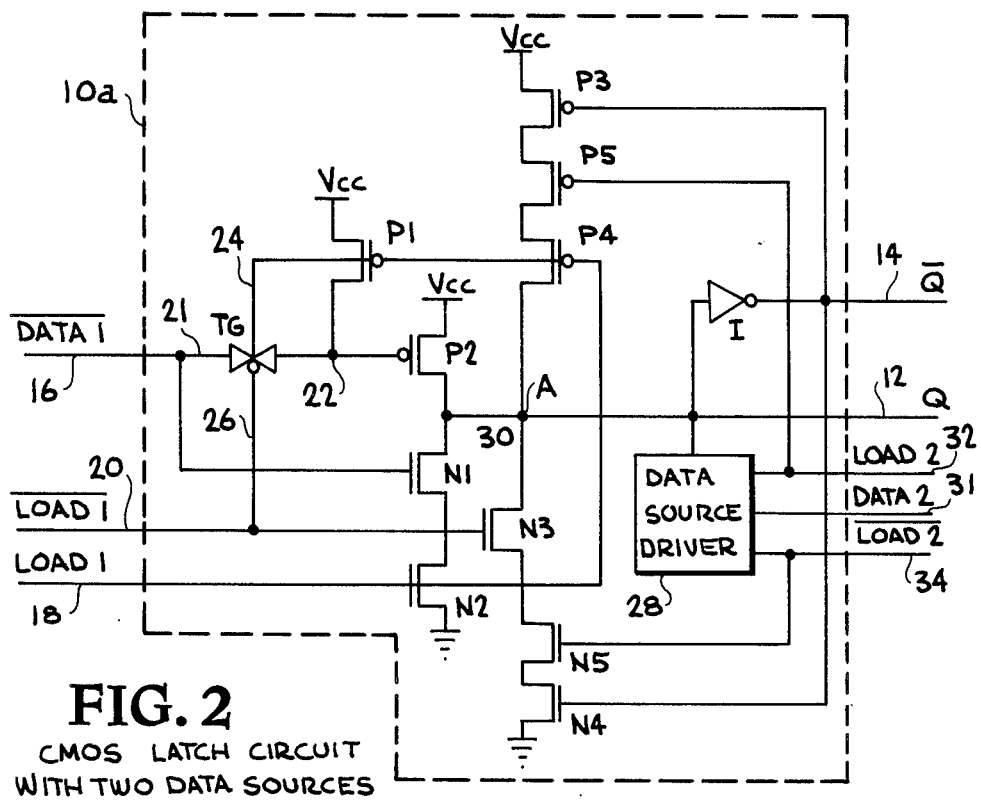
FIG. 2 is a schematic circuit diagram of a second embodiment of a CMOS latch of the present invention.

In FIG. 2, there is depicted an alternate embodiment 10A of the invention differing only in that there is provided a means for loading the latch storage node A at the true data output terminal 12 with an additional or second complementary data input signal DATA2. This is accomplished by the provision of a second data source driver circuit 28 and a feedback driver circuit 30 formed of a P-channel transistor P5 and an N-channel transistor N5. The driver circuit 28 serves to drive the latch storage node A with the second data input signal DATA2 applied to input terminal 31. As can be seen, the transistor P5 has its source-drain conduction path interconnected between the drain of the transistor P3 and the source of the transistor P4, and the transistor N5 has its source-drain conduction path interconnected between the drain of the transistor N4 and the source of the transistor N3. The gate of the transistor P5 is connected to an input terminal 32 for receving a second true load signal LOAD2, and the gate of the transistor N5 is connected to an input terminal 34 for receiving a second complementary load signal $\overline{\text{LOAD2}}$. The transistors P5 and N5 function to disable the drive to the storage node A when the second data signal DATA2 is to being loaded. It should be understood to those skilled in the art that only one of the data signals $\overline{\text{DATA1}}$ or DATA2 is to be loaded at a time. Except for these differences, the functionality and advantages of the present invention remain in this alternate embodiment.

From the foregoing detailed description, it can be seen that the present CMOS latch circuit eliminates the charge-sharing effects, which reduces the high voltage level from the complementary data bus line, since the P-channel drive transistor P2 is used to force the true data output signal Q to the high logic level via the supply potential VCC. Further, the RC delay due to the transmission gate TG is minimized since the N-channel drive transistor N2 is being driven directly from the complementary data bus line and thus only the drive transistor P2 contributes a load to the RC across the transmission gate TG. As a result, it is possible to fabricate larger physically the drive transistors P2 and N1 for increased performance without adversely affecting its reliability.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A CMOS latch circuit comprising:
   a P-channel precharge transistor (P1) having a source connected to a supply potential (VCC), a gate, and a drain;
   a P-channel drive transistor (P2) having a source connected to the supply potential, a gate connected to the drain of said P-channel precharge transistor (P1), and a drain connected to a storage node (A) and a true data output terminal (12);
   an N-channel drive transistor (N1) having a drain connected to the drain of said P-channel drive transistor (P2), a gate connected to a first input terminal (16) for receiving a complementary data input signal, and a source;
   an N-channel enable transistor (N2) having a drain connected to the source of said N-channel drive transistor (N1), a gate connected to a second input terminal (18) for receiving a true load signal, and a source connected to a ground potential;
   a transmission gate (TG) having a signal input line (21) connected to the first input terminal (16), a signal output line (22) connected to the gate of said P-drive transistor (P2), a true control line (24) coupled to the second input terminal (18), and a complementary control line (26) connected to a third input terminal (20) for receiving a complementary load signal;
   a first P-channel output transistor (P3) having a source connected to the supply potential, a gate connected to a complementary data output terminal (14), and a drain;
   a second P-channel output transistor (P4) having a source connected to the drain of said first P-channel output transistor (P3), a gate connected to the gate of said N-channel enable transistor (N2), and a drain connected to the storage node (A);
   a first N-channel output transistor (N3) having a drain connected to the storage node (A), a gate connected to the third input terminal, and a source;
   a second N-channel output transistor (N4) having a drain connected to the source of said first N-channel output transistor (N3), a gate connected to the complementary data output terminal (14), and a source connected to the ground potential; and an inverter (I) having an input connected to the storage node (A) and an output connected to the complementary data output terminal (14).

2. A CMOS latch circuit as claimed in claim 1, wherein said transmission gate is formed of a P-channel transistor and an N-channel transistor.

3. A CMOS latch circuit as claimed in claim 2, wherein the true control line (24) is connected to the gate electrode of the N-channel transistor of said transmission gate (TG) and the complementary control line (26) is connected to the gate electrode of the P-channel transistor of said transmission gate (TG).

4. A CMOS latch circuit as claimed in claim 3, wherein said transmission gate (TG) is turned on when said true load signal is at a high logic level and said complementary load signal is at a low logic level.

5. A CMOS latch circuit as claimed in claim 4, wherein said complementary data input signal is normally precharge to provide a high logic level and is discharged to provide a low logic level.

6. A CMOS latch circuit as claimed in claim 5, wherein when the true data output signal is at a high logic level and the complementary data input signal is at a high logic level said N-channel drive transistor (N1) will be turned on so as to pull the true data output signal to a low logic level.

7. A CMOS latch circuit as claimed in claim 5, wherein when the true data signal is at a low logic level and the complementary data input signal is at a low logic level said P-channel drive transistor (P2) will be turned on so as to pull the true data output signal to a high logic level.

8. A CMOS latch circuit as claimed in claim 1, further comprising means for loading said storage nodes (A) with a second complementary data input signal.

9. A CMOS latch circuit as claimed in claim 8, wherein said loading means comprises drive circuit means (28) coupled to the storage node (A) for driving the true data output terminal (12) with a second data input signal, and feedback driver means (30) coupled to the storage node (A) and being responsive to second true and complementary load signals for disabling of its drive when said second complementary data input signal is being loaded.

10. A CMOS latch circuit as claimed in claim 9, wherein said feedback driver means comprises a P-channel transistor (P5) having its source-drain conduction path interconnected between the drain of said first P-channel output transistor (P3) and the source of said second P-channel output transistor (P4), and an N-channel transistor (N5) having its source-drain conduction path interconnected between the drain of said second N-channel output transistor (N4) and the source of said first N-channel output transistor (N3), the gate of said transistor (P5) being connected to said second true load signal, the gate of said transistor (N5) being connected to receive said second complementary load signal.

11. A CMOS latch circuit comprising:
a P-channel precharge transistor (P1) having a source connected to a supply potential (VCC), a gate, and a drain;
A P-channel drive transistor (P2) having a source connected to the supply potential, a gate connected to the drain of said P-channel precharge transistor (P1), and a drain connected to a storage node (A) and a true data output terminal (12);
an N-channel drive transistor (N1) having a drain connected to the drain of said P-channel drive transistor (P2), a gate connected to a first input terminal (16) for receiving a complementary data input signal, and a source;
an N-channel enable transistor (N2) having a drain connected to the source of said N-channel drive transistor (N1), a gate connected to a second input terminal (18) for receiving a true load signal, and a source connected to a ground potential;
transmission gate means responsive to the true load signal and a complementary load signal for communicating said complementary data input signal to the gate of said P-channel drive transistor (P2); and
output transistor means responsive to said true and complementary load signals and to true and complementary data output signals for maintaining said latch circuit in one of two states.

12. A CMOS latch circuit as claimed in claim 11, wherein said transmission gate means is formed for a P-channel transistor and an N-channel transistor.

13. A CMOS latch circuit as claimed in claim 11, wherein said output transistor means comprises a pair of P-channel output transistors (P3, P4) and a pair of N-channel output transistors (N3, N4), all being connected in series.

* * * * *